United States Patent
Watanabe

(10) Patent No.: US 9,976,210 B2
(45) Date of Patent: May 22, 2018

(54) SHADOW MASK, FILM FORMING SYSTEM USING SHADOW MASK AND METHOD OF MANUFACTURING A DISPLAY DEVICE

(71) Applicant: Japan Display Inc., Minato-ku (JP)

(72) Inventor: Taiki Watanabe, Minato-ku (JP)

(73) Assignee: Japan Display Inc., Minato-ku (JP)

(*) Notice: Subject to any disclaimer, the term of this patent is extended or adjusted under 35 U.S.C. 154(b) by 0 days. days.

(21) Appl. No.: 15/425,224

(22) Filed: Feb. 6, 2017

(65) Prior Publication Data

US 2017/0247788 A1 Aug. 31, 2017

(30) Foreign Application Priority Data

Feb. 29, 2016 (JP) .................................. 2016-037906

(51) Int. Cl.
| | | |
|---|---|---|
| C23C 16/00 | (2006.01) |
| C23C 14/04 | (2006.01) |
| H01L 51/56 | (2006.01) |
| H01L 51/00 | (2006.01) |
| C23C 14/34 | (2006.01) |
| G02F 1/13 | (2006.01) |
| G02F 1/1343 | (2006.01) |

(52) U.S. Cl.
CPC ............ C23C 14/042 (2013.01); C23C 14/34 (2013.01); H01L 51/0011 (2013.01); H01L 51/56 (2013.01); G02F 1/1303 (2013.01); G02F 1/13439 (2013.01)

(58) Field of Classification Search
CPC ...... C23C 14/34; H01L 51/0011; H01L 51/56
See application file for complete search history.

(56) References Cited

U.S. PATENT DOCUMENTS 8,328,944 B2 * 12/2012 Eida ...................... C23C 14/042
  118/504
9,337,374 B2 * 5/2016 Kramer ............... H01L 31/0516

FOREIGN PATENT DOCUMENTS

JP   2008-226689   9/2008
WO  WO2013/145800  10/2013

* cited by examiner

*Primary Examiner* — Jaehwan Oh
*Assistant Examiner* — Andre' C Stevenson
(74) *Attorney, Agent, or Firm* — Oblon, McClelland, Maier & Neustadt, L.L.P.

(57) ABSTRACT

A shadow mask includes a mask foil and a plurality of openings provided on the mask foil in accordance with a shape of at least one region where films are formed on a film forming object. The mask foil has an annular shape where first end of the mask foil and a second end of the mask foil, which is opposed to the first end of the mask foil, are connected to each other.

3 Claims, 4 Drawing Sheets

SHADOW MASK, FILM FORMING SYSTEM USING SHADOW MASK AND METHOD OF MANUFACTURING A DISPLAY DEVICE

CROSS-REFERENCE TO RELATED APPLICATION

The present application claims priority from the Japanese Application JP2016-37906 filed on Feb. 29, 2016, the content of which is hereby incorporated by reference into this application.

BACKGROUND OF THE INVENTION

1. Field of the Invention

The present invention relates to a shadow mask, a film forming system using a shadow mask, and a method of manufacturing a display device.

2. Description of the Related Art

Recent years, a thin display device using a semiconductor element has been put into practical use. When forming an organic layer of an organic EL element or an electrode of a liquid crystal display device by a vapor deposition or sputtering, a shadow mask on which many fine slits are aligned in parallel is used. A shadow mask is also referred to as a vapor deposition mask or a metal mask. For example, a planar mask where a thin mask foil 404 having an opening 402 that is in accordance with a shape of a film to be formed is welded to a frame 400 made of metal as illustrated in FIG. 4 is used. However, as a development of a shadow mask progresses, a development of a shadow mask that is not in a planar form is also proceeded.

For example, Japanese Unexamined Patent Application Publication No. 2008-226689 discloses performing a pattern film formation on a substrate by bringing a roll-shaped mask made of metal into close contact with a substrate that is being conveyed, rotating the mask in synchronization with the conveyance of the substrate, and at the same time providing a sputtering source inside the roll.

Further, WO 2013/145800 A1 discloses that a cylinder-shaped mask retaining device attracts a sheet-shaped mask substrate using an electromagnet and an exposure is performed using the mask substrate.

SUMMARY OF THE INVENTION

In the case where a mask is formed as a rigid body made of metal as in Japanese Unexamined Patent Application Publication No. 2008-226689, there are inconveniences in its handling since the mask is heavy. Further, a film forming object needs to be deformed in accordance with the shape of roll of the mask, and therefore the mask cannot be used for the case where a film is formed for a planar film forming object.

Further, even when a sheet-shaped mask substrate is used as in WO 2013/145800 A1, since an area of the mask substrate and an area of a substrate that is subjected to an exposure need to be equal to each other, a size of the mask cannot be reduced.

The present invention has been made in view of the above problems, and the object of the present invention is to provide a shadow mask and a film forming system having a light weight with a low cost by reducing a material necessary for their formation and also to provide a display device manufactured by the film forming system.

According to one aspect of the present invention, a shadow mask includes a mask foil and a plurality of openings provided on the mask foil in accordance with a shape of at least one region where films are formed on a film forming object. The mask foil has an annular shape where first end of the mask foil and a second end of the mask foil, which is opposed to the first end of the mask foil, are connected to each other.

In one embodiment of the present invention, the at least one region where the films are formed is repeatedly arrayed on the film forming object. The plurality of openings of the mask foil equals a number of the films provided on one of the at least one region.

In one embodiment of the present invention, a length of the mask foil from the first end to the second end is shorter than a length the film forming object.

According to another aspect of the present invention, a film forming system includes a conveying device that conveys a film forming object, an annular shadow mask that has openings in accordance with a shape of at least one region where films are formed on the film forming object and rotates at a speed in accordance with a conveying speed of the conveying device, and a film forming source that injects a film forming material to be deposited toward the film forming object.

In one embodiment of the present invention, the film forming source is arranged inside the annular shadow mask.

In one embodiment of the present invention, the conveying speed at which the film forming object is conveyed and a rotating speed of the annular shadow mask are equal to each other.

According to another aspect of the present invention, a method of manufacturing a display device includes steps of conveying a film forming object including a display panel, rotating an annular shadow mask that has openings in accordance with a shape of at least one region where films are formed on the film forming object at a speed in accordance with a conveying speed of the film forming object, and injecting a film forming material to be deposited toward the film forming object and forming the films on the film forming object.

In one embodiment of the present invention, a speed at which the film forming object is conveyed and a rotating speed of the annular shadow mask are equal to each other.

DETAILED DESCRIPTION OF THE INVENTION

Figure 1:
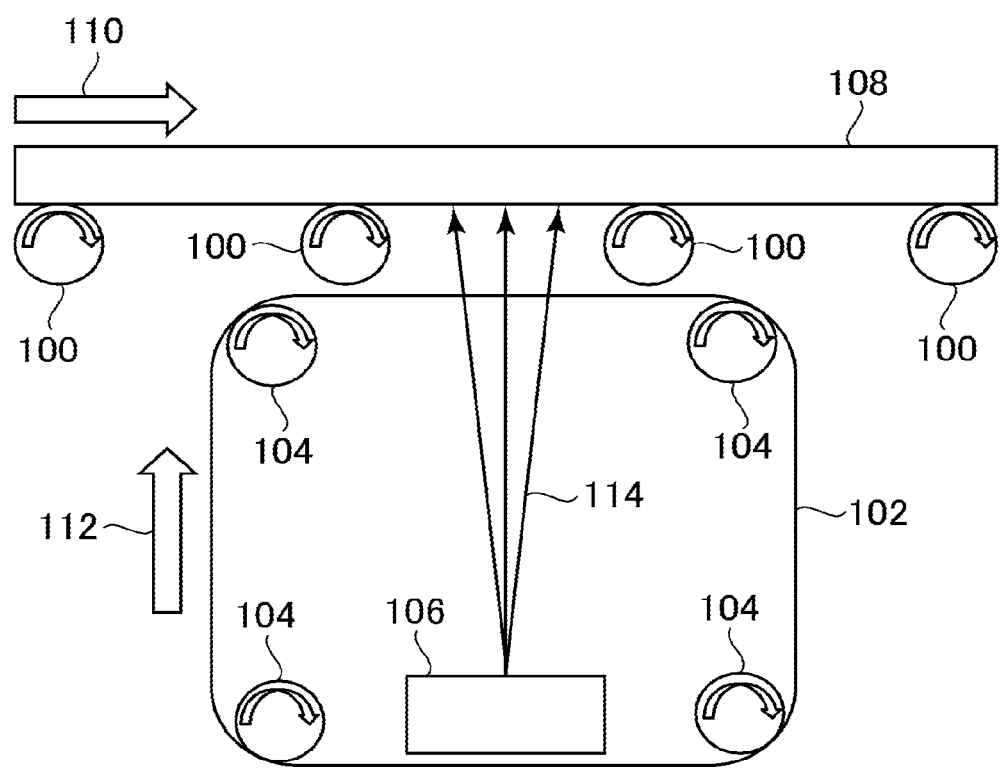
FIG. 1 is a view schematically illustrating a shadow mask according to an embodiment of the present invention.

Below, each embodiment of the present invention is explained with reference to the accompanying drawings. While the width, thickness, shape, and the like of each component in the drawings may be illustrated schematically as compared with actual embodiments in order to clarify the explanation, these are merely examples and the interpretation of the present invention should not be limited thereto. Furthermore, in the specification and respective drawings, the same reference symbols may be applied to elements similar to those that have already been illustrated in another drawing and an explanation of such elements may be omitted as appropriate.

FIG. 1 is a view schematically illustrating a film forming system according to an embodiment of the present invention. As illustrated in the figure, the film forming system is formed to include a conveying device 100, a shadow mask 102, a shadow mask rotating device 104, and a film forming source 106.

The conveying device 100 conveys a film forming object. Specifically, for example, the conveying device 100 is composed of a plurality of rollers that rotate, and conveys a glass substrate 108 that is the film forming object disposed on the rollers in a direction of an arrow 110 on the figure by rotation of the rollers.

Figure 2:
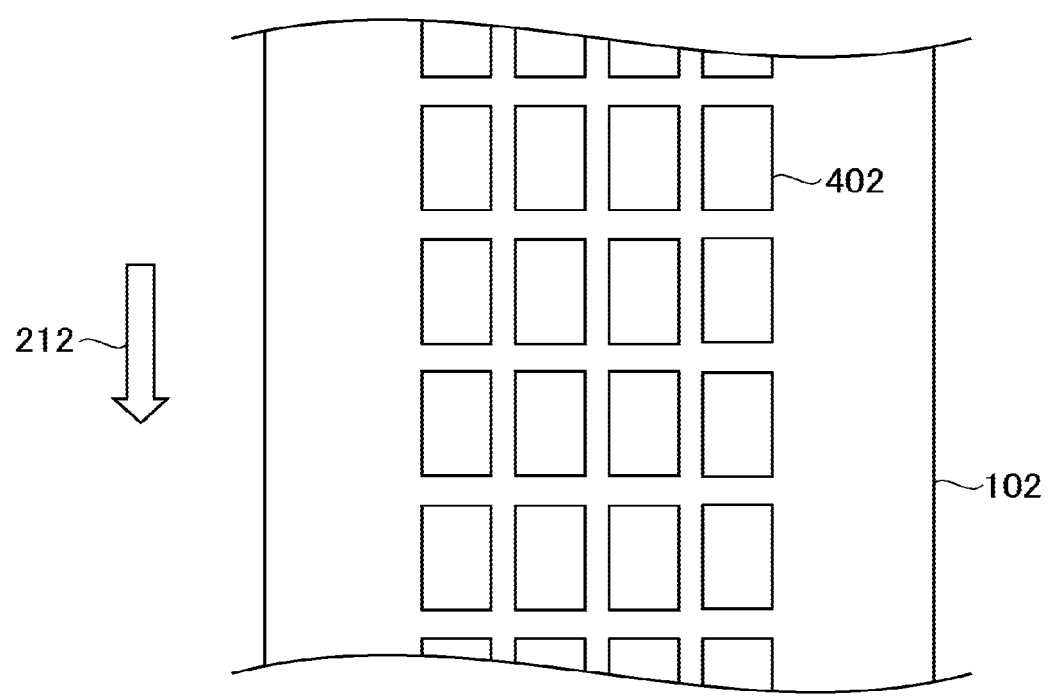
FIG. 2 is a view magnifying a part of the shadow mask.

The shadow mask 102 has, on a mask foil, an opening 402 that is in accordance with a shape of films to be formed on the film forming object, and is formed in an annular shape where the both ends of the mask foils are connected to each other. Specifically, for example, FIG. 2 is a view illustrating a part of the shadow mask 102 that is formed to be in an annular shape. As illustrated in the FIG. 2, in the case where the film forming object is a plurality of display panels formed on one glass substrate 108, the shadow mask 102 has, at respective positions corresponding to the plurality of display panels, openings 402 that are in accordance with a film forming pattern. Further, in FIG. 2, although the upper and lower parts are not illustrated, the upper part and the lower part of the shadow mask 102 are connected to each other, and the shadow mask 102 is formed to be in an annular shape.

Moreover, the shadow mask 102 rotates at a speed that is in accordance with a conveying speed of the conveying device 100. Specifically, for example, the shadow mask 102 rotates at the same speed as the conveying speed of the conveying device 100 by the shadow mask rotation device 104. The rotational direction 212 of the shadow mask 102 illustrated in FIG. 2 corresponds to 112 given in FIG. 1.

In FIG. 2, a pattern to provide, for each one of subpixels of the display panel, a corresponding opening 402 that is rectangular is illustrated as an example, but a film forming pattern is not limited thereto. Specifically, for example, the opening 402 may be formed in a shape of a wire or the like to supply a current to the subpixels of the display panel.

Further, a length of one round of the shadow mask 102 needs not be the same as the length of the film forming object. Specifically, in a case where the openings 402 of the same shape are arranged at predetermined intervals along the rotational direction of the shadow mask 102, it is sufficient if the shadow mask 102 has a length long enough so that one set of the openings 402 is formed. That is, before the conveyance of one film forming object is finished, the one set of the openings 402 formed on the shadow mask 102 contact the film forming object more than once, and thus a film forming pattern that is the same with a film forming pattern of the case where the length of the one round of the shadow mask 102 is the same with that of the film forming object can be formed.

Further, in FIG. 1, although a space as large as the roller included in the conveying device 100 is provided between the shadow mask 102 and the film forming object, it is preferable to set the space between the shadow mask 102 and the film forming object to be as small as possible. Specifically, for example, it may be arranged that the rollers included in the film forming device are provided at positions so that they do not interfere with the shadow mask rotating device 104, and thus the shadow mask 102 closely contacts the film forming object.

Further, the shadow mask 102 of the present invention can be detached from the shadow mask rotating device 104. Therefore, in the case where a shape of the film forming pattern is changed, it is sufficient to replace the shadow mask 102 only.

The shadow mask rotating device 104 rotates the shadow mask 102 formed in an annular shape. Specifically, the shadow mask rotating device 104 is composed of the plurality of rollers that rotate. Further, the shadow mask 102 is loaded so as to surround all of the rollers with a tension large enough so that it is not loosened. Further, the shadow mask rotating device 104 rotates the shadow mask 102 in the direction of the arrow 112 on the figure by the rotation of the rollers.

The film forming source 106 injects a film forming material to be deposited toward the film forming object. Specifically, for example, the film forming source 106 is disposed inside the shadow mask 102 that is annular, and injects the film forming material to be deposited in the direction of the arrow 114 on the figure toward the glass substrate 108 through the openings 402 of the shadow mask 102. Here, as the film forming source 106, a vapor deposition source or a sputtering source, for example, is used, but a device that deposits other film forming materials may be used as well. Further, in order to prevent deposition of the film forming material on the glass substrate 108 via an opening 402 other than a one at a position right in front of the film forming object, it may be configured that a shutter is provided over the film forming source 106.

Figure 3:
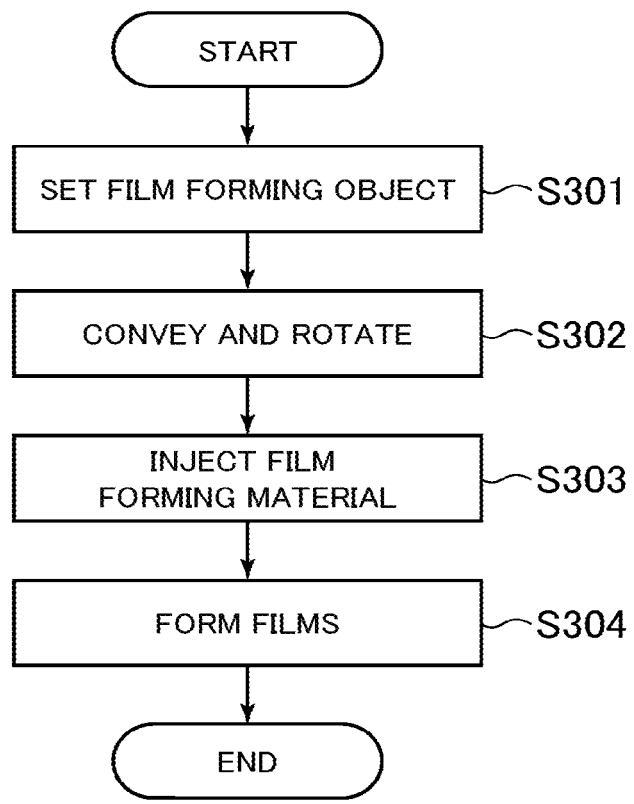
FIG. 3 is a diagram illustrating a flow of a method of manufacturing a display device.
Figure 4:
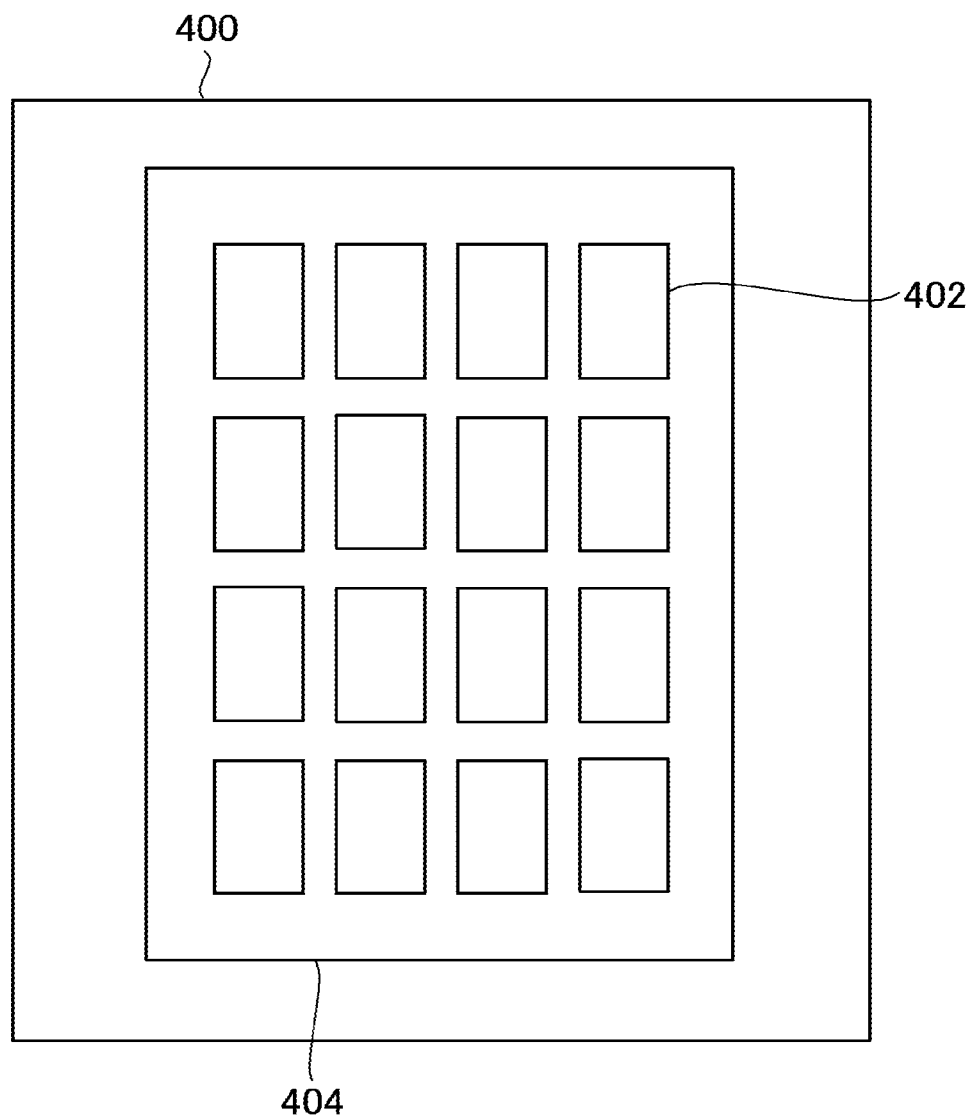
FIG. 4 is a view illustrating an example of a conventional shadow mask.

Subsequently, a method of manufacturing a display device using the above film forming system is explained with reference to FIG. 3. This method of manufacturing a display device includes a step of conveying a display panel, a step of rotating the shadow mask 102 that is annular having the openings 402 in accordance with a shape of films to be formed at a speed in accordance with the conveying speed of the conveying device 100, and a step of injecting the film forming material to be deposited toward the substrate and forming films on the display panel.

Specifically, first, the glass substrate 108 that is the film forming object is set on the rollers of the conveying device 100 (S301). Subsequently, the conveying device 100 starts conveying the glass substrate 108 and at the same time the shadow mask rotating device 104 starts rotating the shadow mask 102 (S302). The conveyance of the glass substrate 108 and the rotation of the shadow mask 102 are performed synchronously against the film forming object so that films are formed at a predetermined position.

Subsequently, the film forming source 106 starts injecting the film forming material (S303). Then, the film forming is performed when the film forming object reaches a region where the film forming material is deposited (S304). Specifically, for example, the film forming material injected by the film forming source is deposited on the glass substrate 108 via the openings 402 provided on the shadow mask 102, and the film forming is thereby performed. By the above steps, films of pattern corresponding to the opening 402 formed on the shadow mask 102 are formed on the glass substrate 108. The formed films include, for each one of the subpixels of the display panel, a light emitting element film made of a light emitting material and an electrode for applying a current to the light emitting element film, corresponding thereto, as illustrated in FIG. 2, for example.

Although the method of manufacturing a display device includes a step other than the step of forming the films of the pattern corresponding to the above opening 402, but the explanation thereof is omitted here.

The conveyance of the glass substrate 108 and the rotation of the shadow mask may be performed in a style in which they are consecutively proceeded through the film forming step. Or, the film forming and the substrate conveying may be separated in time series, in a style such as "form the film for each area, convey the substrate and the shadow mask, stop the substrate and the shadow mask, and form the film for the next area".

While there have been described what are at present considered to be certain embodiments of the invention, it will be understood that various modifications may be made thereto, and it is intended that the appended claims cover all such modifications as fall within the true spirit and scope of the invention.

What is claimed is:

1. A film forming system comprising:
a conveying device that conveys a film forming object;
an annular shadow mask that has openings in accordance with a shape of at least one region where films are formed on the film forming object and rotates at a speed in accordance with a conveying speed of the conveying device; and
a film forming source that injects a film forming material to be deposited toward the film forming object.

2. The film forming system according to claim 1,
wherein the film forming source is arranged inside the annular shadow mask.

3. The film forming system according to claim 1,
wherein the conveying speed at which the film forming object is conveyed and a rotating speed of the annular shadow mask are equal to each other.

* * * * *